United States Patent
Kraz

(10) Patent No.: US 7,576,304 B2
(45) Date of Patent: Aug. 18, 2009

(54) MONITOR DEVICE FOR MONITORING THE EXPOSURE OF CIRCUITS TO CURRENT AND VOLTAGE FROM A TOOL

(75) Inventor: Vladimir Kraz, Santa Cruz, CA (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/266,094

(22) Filed: Nov. 2, 2005

(65) Prior Publication Data

US 2007/0095798 A1    May 3, 2007

(51) Int. Cl.
*H05B 1/02* (2006.01)

(52) U.S. Cl. .................. 219/506; 219/497; 219/494; 340/514; 340/636.12; 340/655

(58) Field of Classification Search ............. 219/490, 219/494, 506, 497, 501, 505, 499; 340/5 H, 340/636.12, 636.13, 649, 650, 653, 655, 340/659–664, 514
See application file for complete search history.

(56) References Cited

U.S. PATENT DOCUMENTS

| 4,939,453 | A |   | 7/1990  | Kautter et al. .............. 324/158 |
|-----------|---|---|---------|--------------------------------------|
| 5,073,758 | A | * | 12/1991 | Postlewait et al. .......... 324/713 |
| 5,083,117 | A | * | 1/1992  | Hoigaard .................... 340/649 |
| 5,463,379 | A | * | 10/1995 | Campbell et al. ........... 340/657 |
| 5,659,245 | A | * | 8/1997  | Ping et al. ................. 324/158.1 |
| 6,310,557 | B1 |  | 10/2001 | Nelsen et al. ............... 340/649 |

FOREIGN PATENT DOCUMENTS

EP          0 435 047 A2      8/1990

OTHER PUBLICATIONS

"EOS from Soldering Irons Connected to Faulty 120V AC Receptacles"—W. Farwell, K. Hein, D. Ching; Raytheon Corp., 2005 EOS/ESD Symposium; Sep. 12-16, 2005.

* cited by examiner

*Primary Examiner*—Mark H Paschall
(74) *Attorney, Agent, or Firm*—Johannes P. M. Kusters

(57) ABSTRACT

A device for monitoring the voltage or current applied to sensitive components on a circuit board by an assembly tool protects the sensitive components from damage caused by the voltage or current applied to the circuit board.

21 Claims, 18 Drawing Sheets

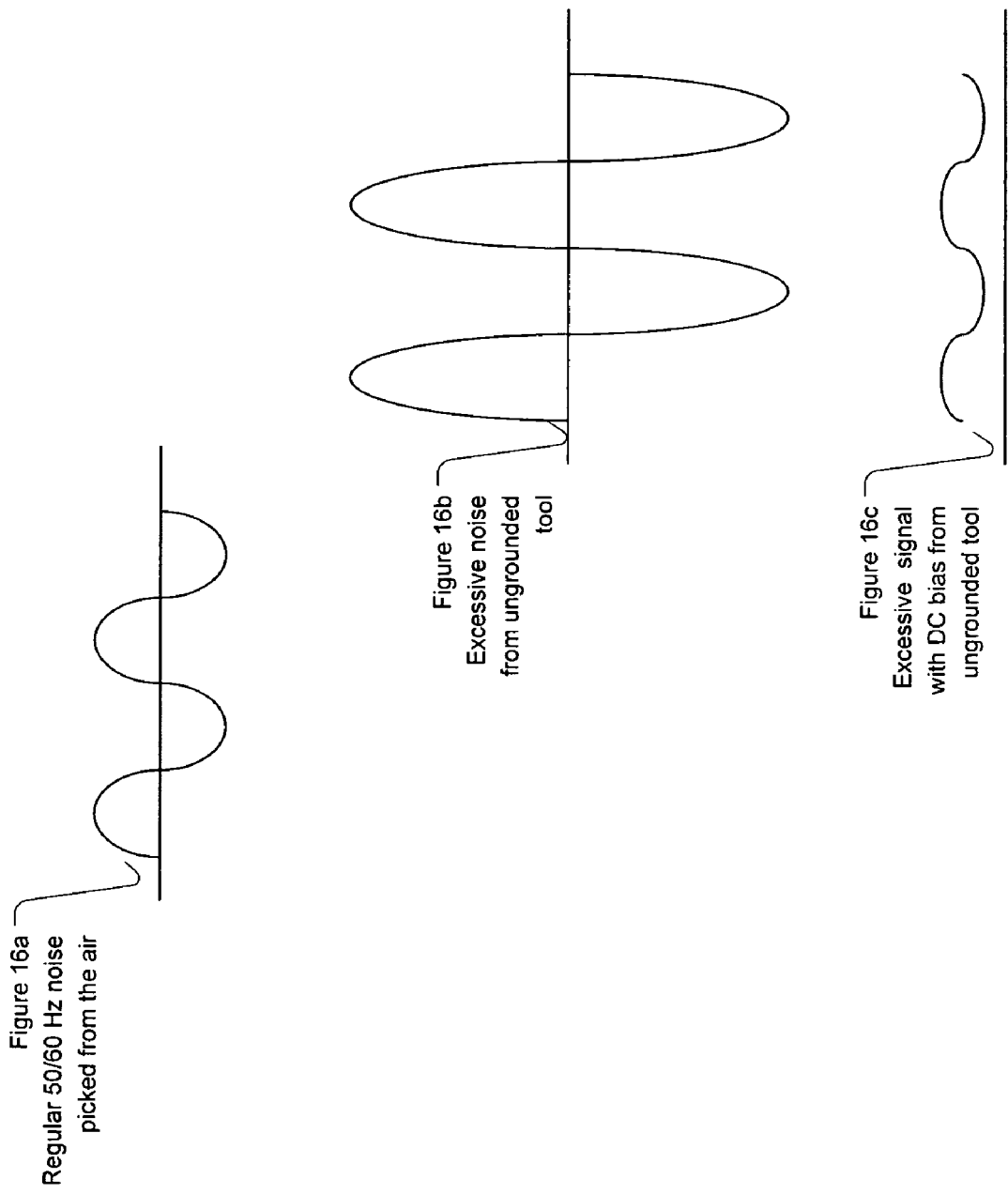

MONITOR DEVICE FOR MONITORING THE EXPOSURE OF CIRCUITS TO CURRENT AND VOLTAGE FROM A TOOL

FIELD OF THE INVENTION

The invention relates to a device for monitoring the exposure of electric circuits to voltages and currents applied to the circuit board containing the electric circuits by an assembly tool, such as a soldering iron or a screwdriver.

BACKGROUND OF THE INVENTION

During the assembly of electronics, various tools are used wherein the tool, such as a soldering iron, may provide a metal-to-metal contact with electrostatic discharge (ESD) sensitive components during the assembly process. If the soldering iron or other tool is defective or if the grounding of the tool is lost, sensitive components can be exposed to an excessive voltage that damages the components. For a soldering iron, there are two main sources of voltage on the tip of a typical soldering iron: poor grounding and induction. If the grounding of the soldering iron is missing or inadequate, then the voltage at its tip can be as high as ½ of the supply voltage to the iron. The grounding of a soldering iron can fail for many reasons including a defective electrical outlet, a missing grounding wire, grounding to a non-existing ground, etc. Even if grounding of the soldering iron is good, the tip of the soldering iron itself often does not have a consistent galvanic connection to the body of the soldering iron and, consequently, to ground. The lack of galvanic connection is due to either construction of the iron itself or to the fact that the tip works at a high temperature that promotes development of oxides that block galvanic contact. When the tip does not have the galvanic connection, the tip becomes capacitively coupled to the heating element of the soldering iron and can have excessive voltage on it that can be transferred to the sensitive components. It is desirable to avoid exposing the sensitive components to these voltages or currents from the tools used to assemble the electronics with the sensitive components.

A particular well known standard (Section 5.1.2.2 of MIL-STD-2000A) specifies that no more than 2 mV may exist on the tip of a soldering iron due to the concern for damaging the sensitive components. Various methods are used today to identify soldering iron with excessive voltage on its tip. For example, one known system checks the voltage on the tip of the soldering iron every time the tip comes into contact with a cleaning wet sponge that has a metal electrode underneath the sponge that is connected to a monitoring device. While this method does perform some monitoring of the voltage on the tip, the accuracy of this device is under question due to the uncertain resistance of the sponge that may vary radically depending on the amount of water in the sponge when the tip contacts the sponge. In addition, this system does not provide a direct method of testing the voltage since the circuit being assembled may have a different voltage on it for whatever reason as compared to the voltage applied to the sponge and the electrode that is measured using the device. In addition, there is no guarantee that the worker would use the sponge to clean the tip since other ways of cleaning the tip are available so that the voltage at the tip might not be regularly measured.

Due to the increasing sensitivity of electronics components, it is becoming more and more important to know at all times whether the soldering iron (or other tool) is exposing components to dangerous voltage levels. The above conventional system does not provide an adequate solution. Thus, it is desirable to provide a monitor device and method that overcomes the above limitations of the conventional system and it is to this end that the present invention is directed.

SUMMARY OF THE INVENTION

A device for monitoring a voltage or current that may be applied to sensitive components on a circuit board is described. The device prevents those sensitive components from being damaged by the voltage or current. In one embodiment, the device is used to monitor the voltage or current applied to circuits on the circuit board by an assembly tool while assembling the circuits on the circuit board. The assembly tool being monitored may be a soldering iron. The device may also monitor the ground connection of the assembly tool.

In accordance with the invention, a device for monitoring the exposure of a sensitive component on a circuit board to a tool used to assemble the sensitive components on the circuit board is provided. The device has a measuring circuit that determines a voltage or a current applied to a circuit board by an assembly tool wherein the voltage or current is directly measured. The device also has a circuit that generates a signal indicating one of the voltage and current applied to the circuit board when the tool touches the circuit board. The circuit that generates the signal may be an alarm circuit that generates an alarm when the voltage or current exceeds a preset threshold value at which the sensitive components on the circuit board are likely to be damaged. The measuring circuit may be connected between ground and the circuit board through a resistor. The device may also have an amplifier coupled between the circuit board and the measuring circuit that amplifies the voltage applied to the circuit board. In one embodiment, the device may consist of a test pad onto which a tip of the assembly tool is placed in order to determine a voltage at the tip of the assembly tool.

The measuring circuit may be a voltage determining circuit. The voltage determining circuit may be an analog measuring circuit or a digital measuring circuit. The analog measuring circuit may be a window comparator. The digital measuring circuit may be an analog to digital converter and a processor wherein the voltage determining circuit compares a digital signal corresponding to the voltage applied to the circuit board to a minimum level and a maximum level and generates an output signal when the voltage from the circuit board is greater than the maximum level. The processor may also have a memory to store the data generated by the processor. The measuring circuit may also include a peak detector that measures a short transient signal that occurs when the assembly tool touches the circuit board and generates a signal representative of the short transient signal. The measurement circuit may also include a ground monitoring circuit that measures the ground of the assembly tool. In another embodiment of the device, the measuring circuit may be a current measurement circuit that measures a current applied to the circuit board by the assembly tool. The current measurement circuit may be an ampermeter or a current transformer sensor.

The alarm circuit of the device may include one or more of a buzzer and/or at least one light emitting diode. The device may also include a disabling circuit that disables the assembly tool when one of the voltage and current exceeds the preset threshold value. The disabling circuit may be a relay that cuts off the power from the assembly tool. The device may also have a circuit that measures the electrostatic discharge that occurs when the assembly tool touches the circuit board.

BRIEF DESCRIPTION OF THE DRAWINGS

FIGS. 16A-C are diagrams illustrating waveforms of typical 50/60 Hz noise, the signal from an ungrounded tool and the signal with DC bias from an ungrounded tool, respectively.

DETAILED DESCRIPTION OF A PREFERRED EMBODIMENT

The invention is particularly applicable to the monitoring of the voltage/current at the tip of a soldering iron and it is in this context that the invention will be described. It will be appreciated, however, that the device and method in accordance with the invention has greater utility since the monitoring device and method may be used to monitor the voltages or currents applied by a variety of tools or any other conductive object, such as tweezers, pliers or a screwdriver, that might expose sensitive components to undesirable voltages. For purposed of this invention, the other conductive objects may also be known as tools.

Figure 1:
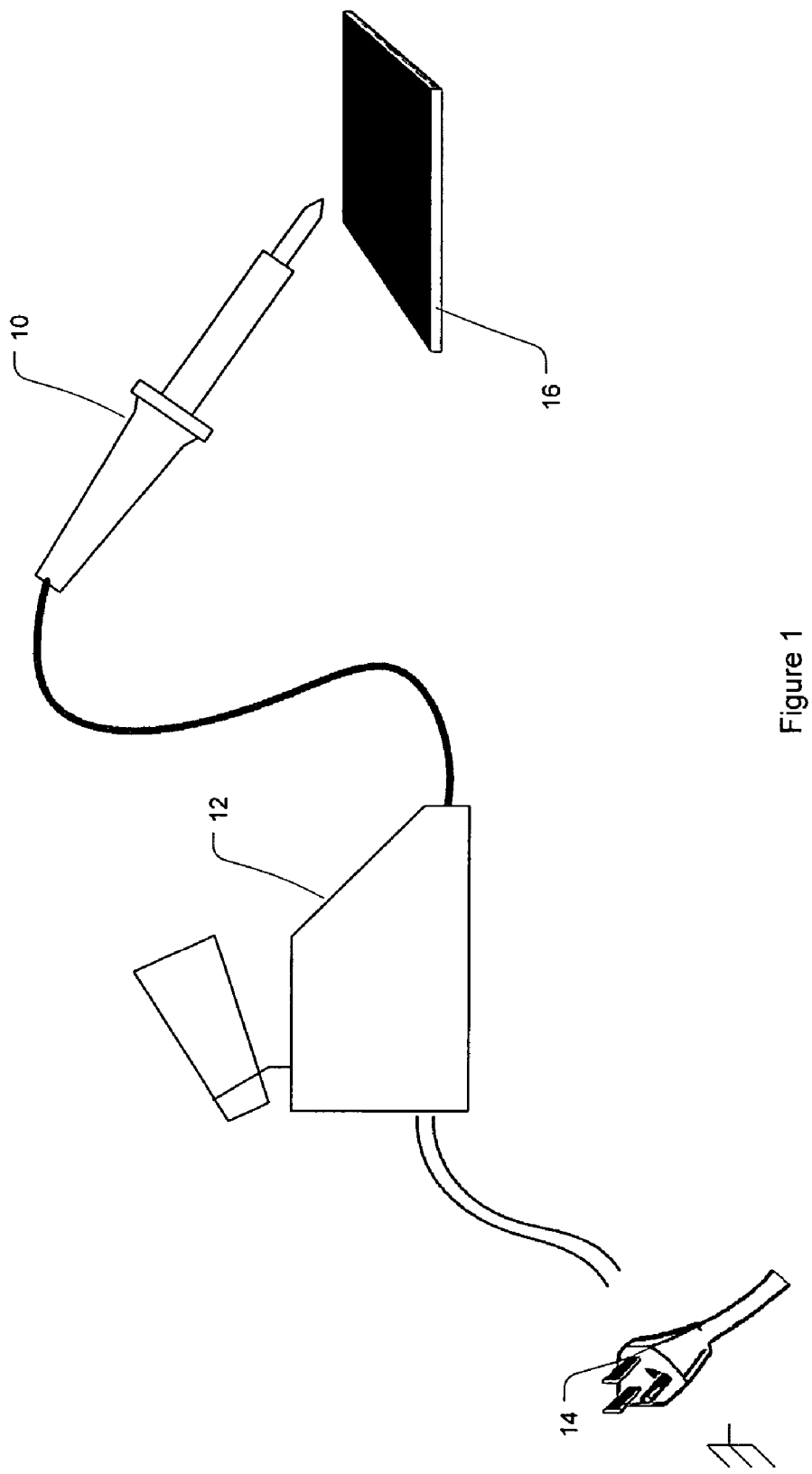
FIG. 1 shows typical electronic assembly arrangement.
Figure 2:
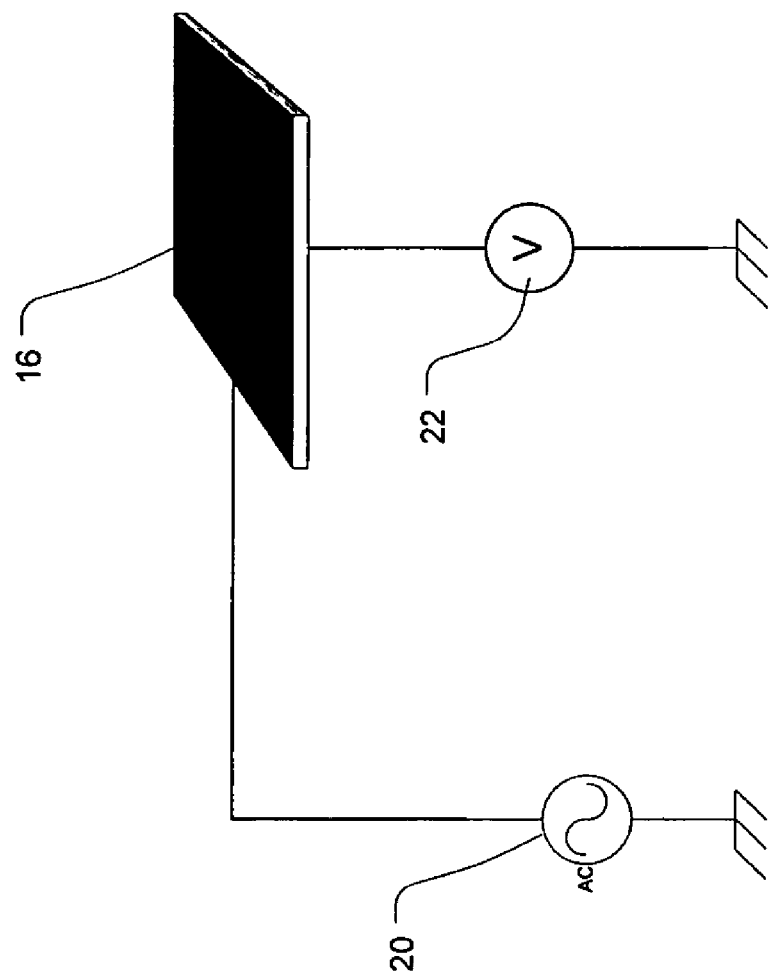
FIG. 2 depicts an equivalent circuit schematic for the arrangement of FIG. 1.

FIG. 1 shows a typical electronic assembly arrangement. In this arrangement, a soldering iron 10 is typically connected to a control unit 12 that, in turn, is plugged into an electrical outlet using a plug 14 that normally has a grounding contact (such as the round center post shown on the plug 14.) When the soldering iron is being used to work on a circuit board 16, the soldering iron touches pads and components on the circuit board 16 and may cause the pads and components of the circuit board to be exposed to an undesirable voltage or current that might damage the components due to the inadequate grounding of the soldering iron or insufficient galvanic connection. FIG. 2 depicts an equivalent circuit schematic for the arrangement of FIG. 1. In the circuit shown in FIG. 2, the poorly-grounded or ungrounded soldering iron is represented here as a voltage source 20 that develops a voltage 22 on the circuit board 16 wherein that voltage may damage sensitive components on the circuit board.

Figure 3:
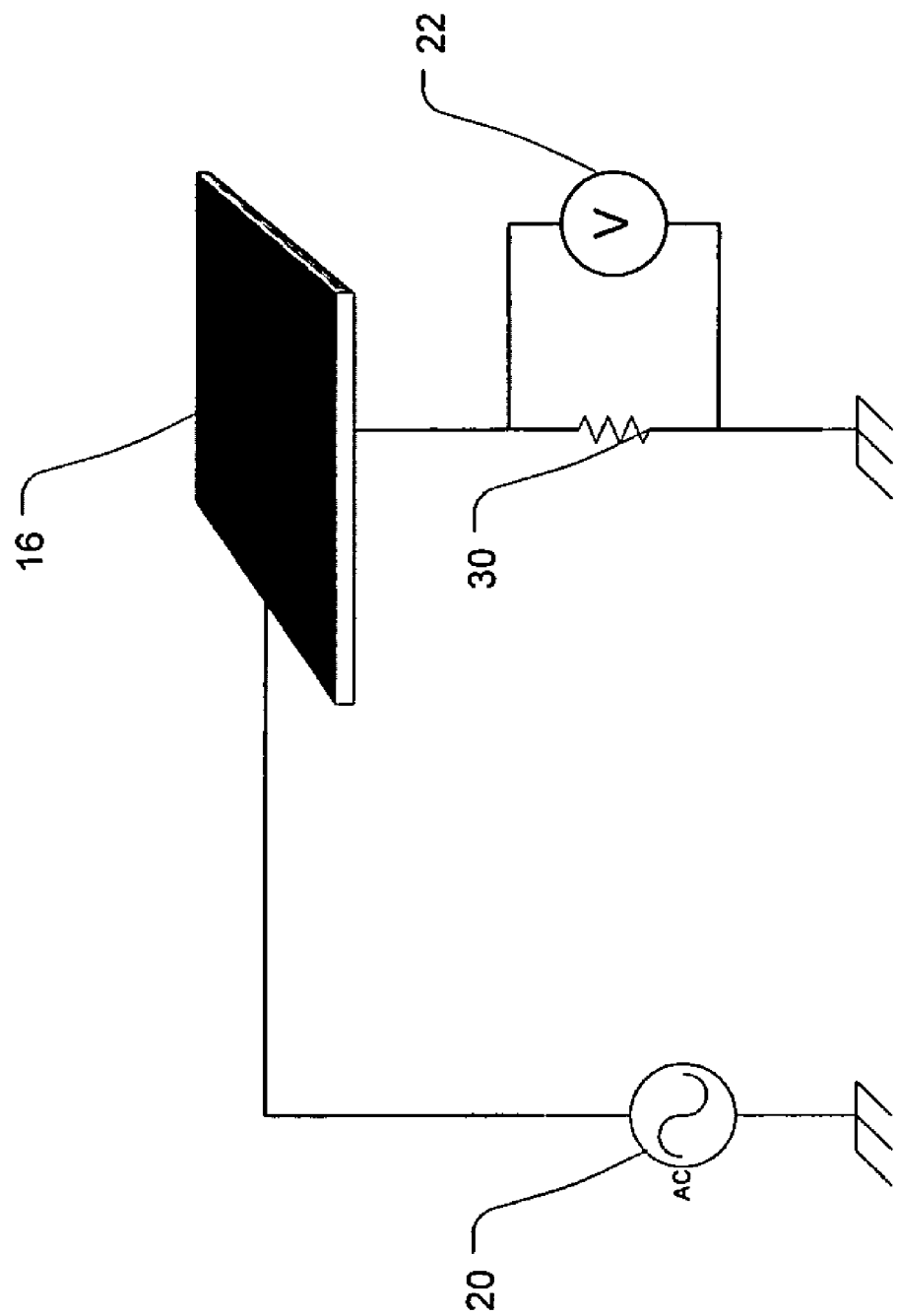
FIG. 3 illustrates a method for calculating a current that results from a tool, such as a soldering iron, touching a circuit board.

FIG. 3 illustrates a method for calculating a current that results from a tool, such as a soldering iron, touching a circuit board. In particular, when the circuit board 16 shown in FIGS. 2 and 3 is grounded via a resistance 30, the voltage 22 across this resistance 30 and the knowledge of the value of this resistance permits the calculation of the current through the circuit board resulting from touching the circuit board 16 with the soldering iron. It should be noted that the grounding of the circuit board is a preferred method since it eliminates any incidental voltage on the circuit board due to any induced static voltage. Now, a device in accordance with the invention that may be used to monitor the voltage to which the circuit board is being subjected by the soldering iron is described.

Figure 4:
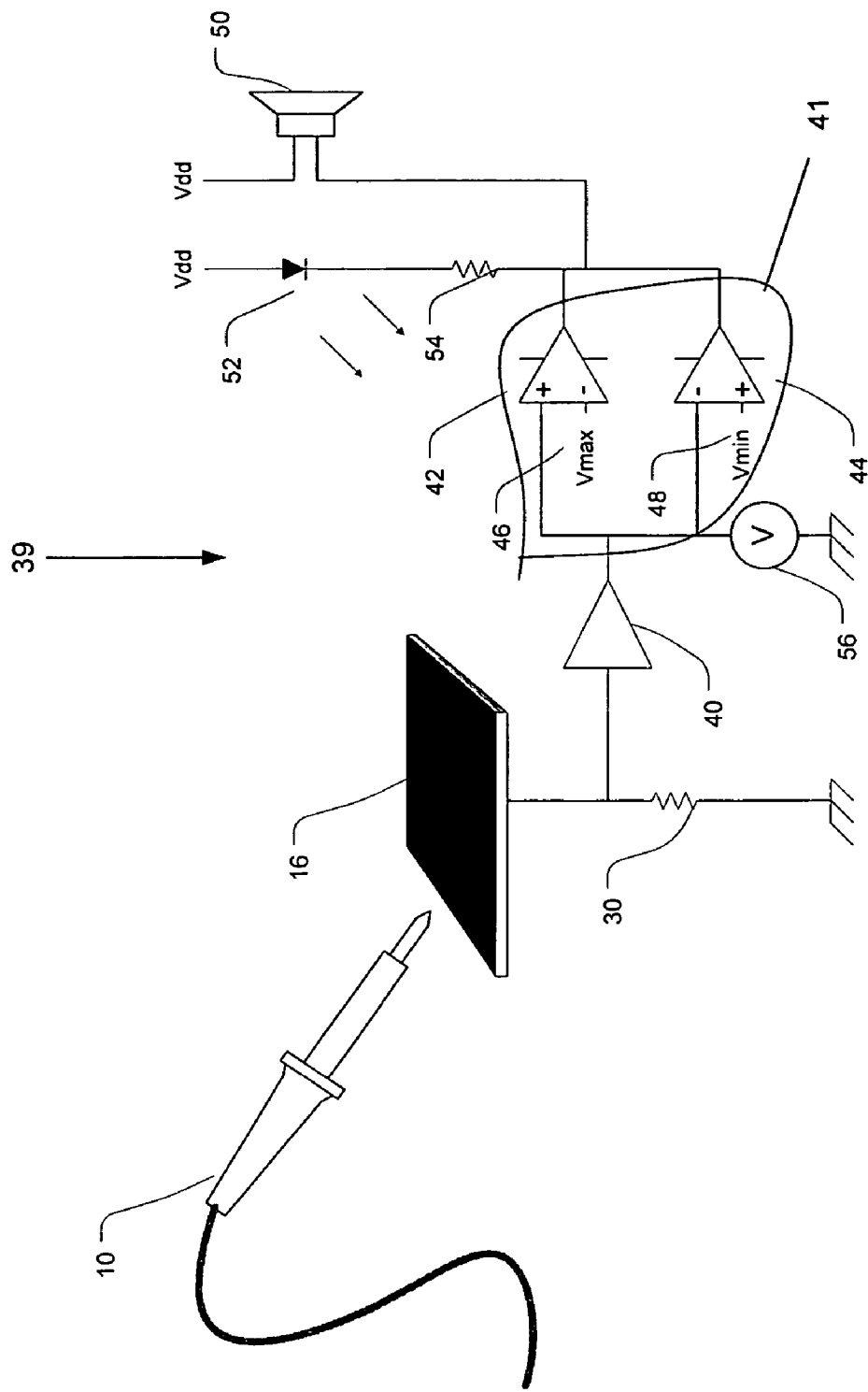
FIG. 4 illustrates an example of one embodiment of a monitoring device in accordance with the invention.

FIG. 4 illustrates an example of one embodiment of a monitoring device 39 that may be used to monitor the voltage to which the circuit board 16 and its components are exposed when the circuit board is touched by a soldering iron 10. When the soldering iron 10 touches the circuit board 16, the soldering iron supplies a voltage to the circuit board. A resistance 30, such as a resistor, provides a ground path for the circuit board. It should be noted, however, that the device 39 in accordance with the invention may be implemented without the grounding of the circuit board via resistor 30.

In operation, the voltage from the circuit board 16 is provided to an input of an amplifier 40 (which is an optional part of the device and is not required to implement the device) that amplifies the signal to a magnitude sufficient for operation of the next stage of the device. The output of the amplifier (or the voltage from the circuit board if the amplifier is not used) is supplied to an input of an analog measuring circuit that may by a window comparator 41. In this example of the device, the window comparator is implemented as a first comparator 42 and a second comparator 44 (wherein each comparator is an operational amplifier) wherein the output of the amplifier is connected to a positive input of the first comparator and to the negative input of the second comparator. However, the window comparator of FIG. 4 may also be implemented in other known ways that are within the scope of the invention. In the embodiment shown in FIG. 4, the comparators used have open-drain or open-collector outputs (such as in industry-standard LM339 parts), therefore it is possible to connect outputs of several comparators together as shown in FIG. 4.

The maximum and minimum voltage levels for the window comparator are provided by any conventional means to the inputs of the comparators 42, 44 as Vmax (46) and Vmin (48). If the voltage at the output of amplifier 40 (or from the circuit board 16 when the amplifier is not part of the device) exceeds the set limits of the window comparator, a signal is generated that indicates that the voltage or current applied to the circuit board 16 exceeds either a maximum or minimum limit. In different embodiments of the device, the generated signal may be a signal that indicates that the voltage/current exceeds the limits, a signal that indicates the value of the voltage/current being applied to the circuit board, a signal that is used to generate an alarm (as is shown in the device of FIG. 4) or a signal that may be used to disable the tool that is applying the voltage/current to the circuit board. Both the minimum and maximum bounds for all of the embodiments of the device are needed since the voltage from the tool may be AC so that the maximum negative swing of the AC voltage (which can also damage the components) is measured by comparing it to the minimum limit (and generating an indication when the lower limit is exceeded) while the maximum positive swing of the AC voltage is measured by comparing it to the maximum limit (and generating an indication when the maximum limit is exceeded). The typical voltage on a circuit board induced by the mains (which should not be identified as a danger) could be in the range of tens of millivolts AC and zero DC, while the voltage from an ungrounded tool can be in the range of hundreds of millivolts or higher and can include DC voltage. The voltage induced by the mains is a continuous sine wave or a modified sine wave while the transient signals induced on the circuit board by touching it with a tool having a different potential has clearly identifiable transient characteristics. Thus, the minimum and maximum levels of the device are set to filter out the voltage induced by the mains and may be set at the appropriate levels.

The alarm circuit in this example consists of a buzzer 50 and a LED 52 with its protective resistor 54. A voltmeter 56 that may be part of the device shown in FIG. 4 displays the actual voltage (taking the optional gain into account if the amplifier 40 is used) on the circuit board 16. As described above, the resistor 30, though desirable, is not necessary for proper operation of the device. Now, another embodiment of the device is described.

Figure 5:
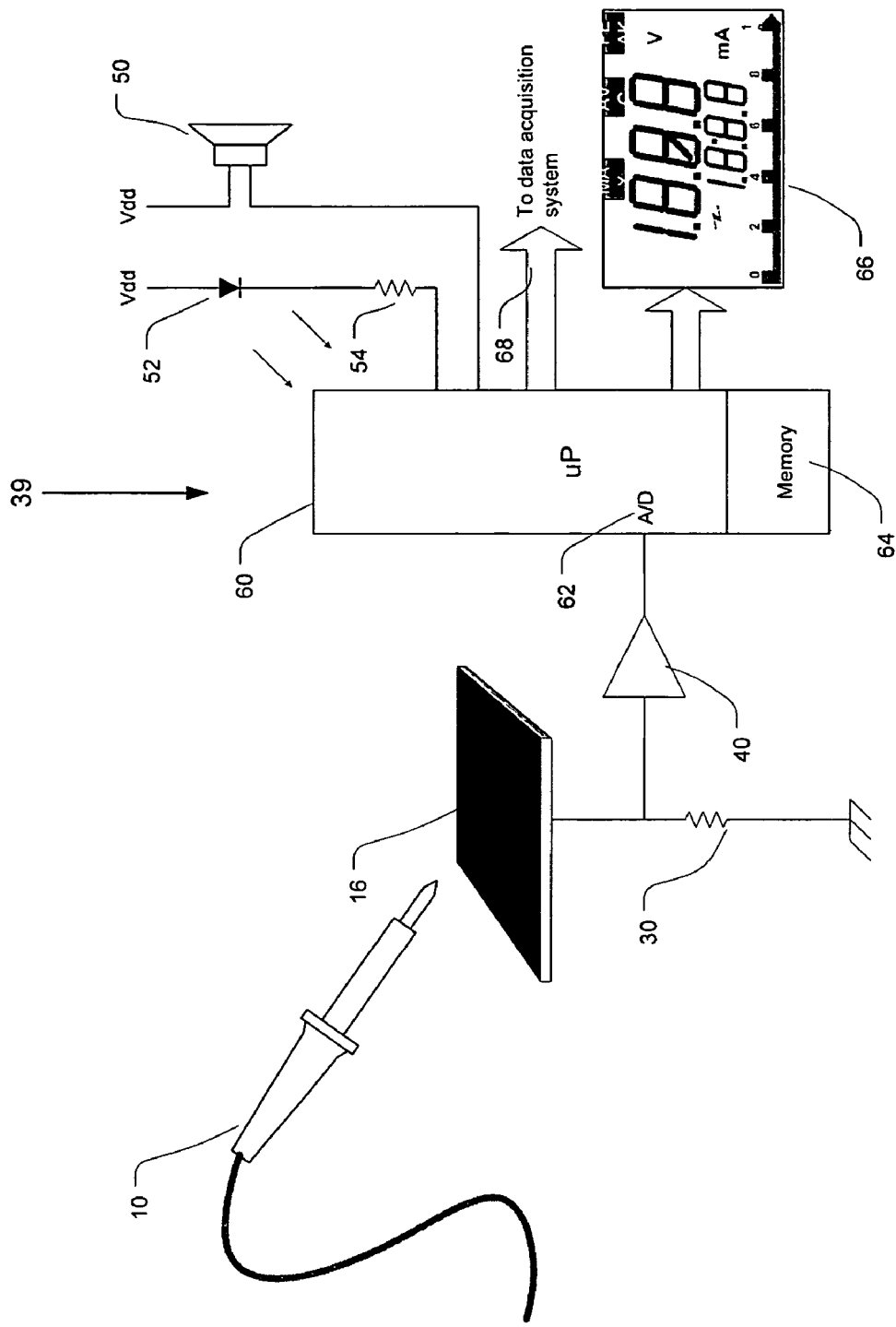
FIG. 5 depicts an example of another embodiment of the monitoring device in accordance with the invention.

FIG. 5 depicts an example of another embodiment of the monitoring device 39. Any elements in this example that have the same reference number as in FIG. 4 have the same functions and will not be described further. The device 39 of this embodiment uses a digital measuring circuit that may be a processor 60, such as a microprocessor, that has an analog-to-digital converter 62 and a memory 64 wherein the A/D converter and memory may or may not be integrated into the same substrate/chip as the processor. The A/D converter 62 converts the input analog voltage signal (from the amplifier 40 or directly from the circuit board if the amplifier is not used) to a digital format that can be input into the processor. The processor 60 may then make a determination whether this digital representation of the voltage signal is within an acceptable range wherein microcode/instructions/firmware within the processor 60 performs this determination. If the voltage signal is not within the limits, the alarm is activated as described above wherein the processor 60 generates the signals to activate the LEDs or buzzer. In this embodiment, the device 39 may include a display 66 connected to the processor that can show the actual voltage on the circuit board 16. The device 39 may also include an output 68 for remote data collection wherein the voltage levels may be output from the processor to the remote data collection system. The data can be output to the remote data collection system over a wired or wireless link. The memory 64 may store the instructions/firmware executed by the processor to determine if the voltage level exceeds a set limit and may also store the collected voltage level data of the circuit board to permit data logging of the collected data.

Figure 6:
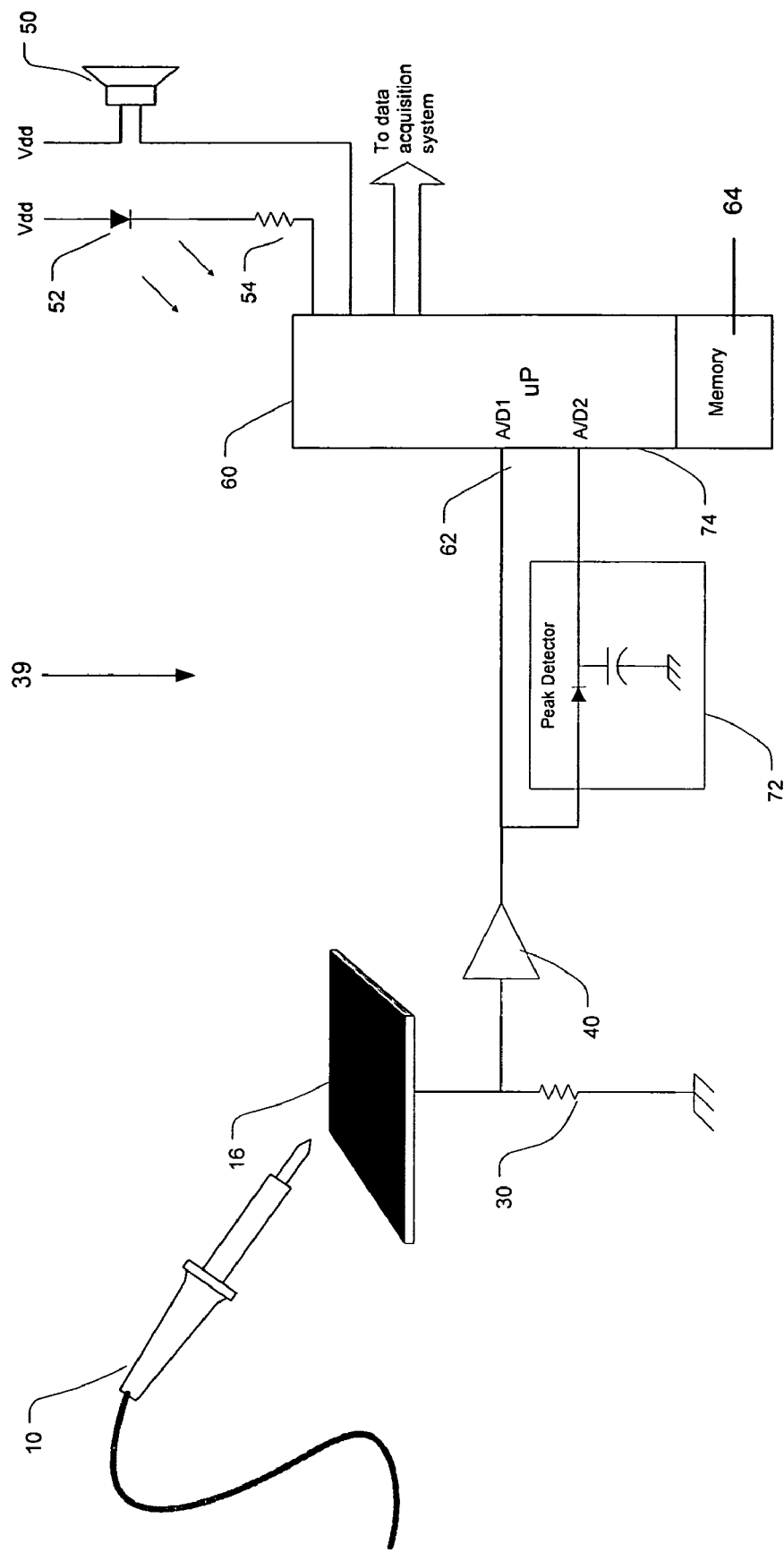
FIG. 6 depicts an example of another embodiment of the monitoring device in accordance with the invention.

FIG. 6 depicts an example of another embodiment of the monitoring device 39. Any elements in this example that have the same reference number as in FIG. 4 have the same functions and will not be described further. In this embodiment, the device 39 may be the digital measuring circuit and may further comprise a peak detector 72 connected to the voltage output from the amplifier 40 (or the voltage from the circuit board when the amplifier is not used) wherein the peak detector provides an output signal that is input to a second A/D converter 74 of the processor 60. In the example shown in FIG. 6, the peak detector may be implemented using a diode and a capacitor as shown, but the peak detector also may be implemented in other various well known manners that are within the scope of this invention. The peak detector allows the device 39 to capture and measure the short transient signals that are often present especially when a metal object touches the circuit board. The data digital generated from the analog to digital converter and the peak detector may also be stored in the memory 64 for data logging and output to a remote data acquisition system as described above.

Figure 7:
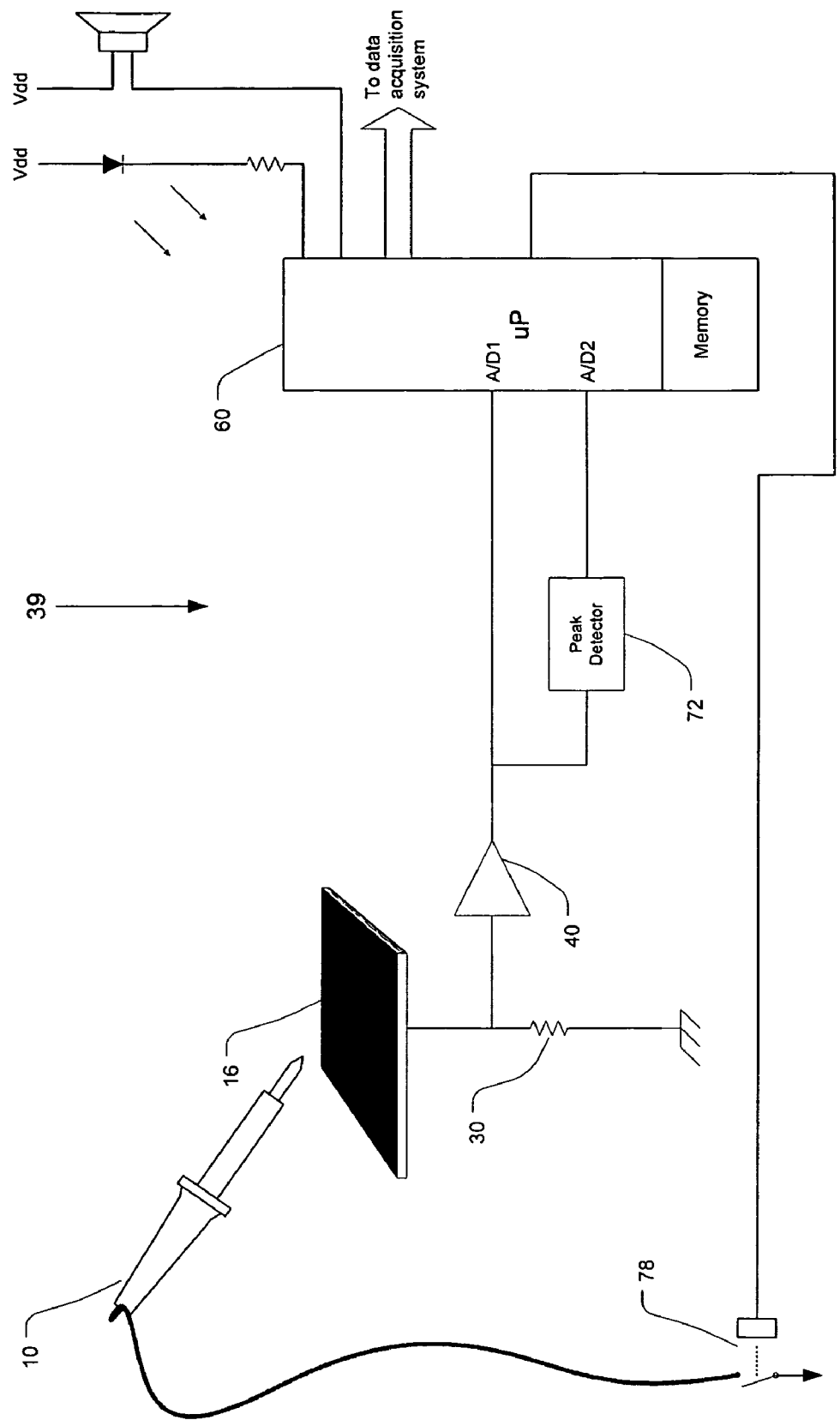
FIG. 7 depicts an example of another embodiment of the monitoring device in accordance with the invention.

FIG. 7 depicts an example of another embodiment of the monitoring device 39. As above, like numbered elements have the same function and are not described further. In this embodiment, the device 39 may further comprise a mechanism 78 that allows the device 39 (using a control signal generated by the processor 60 in response to a voltage signal that exceeds the preset limits) to remotely disable the soldering iron 10. In one example, the disabling mechanism is a relay that automatically disconnects the soldering iron from power supply in case of excessive voltage on the circuit board.

Figure 8:
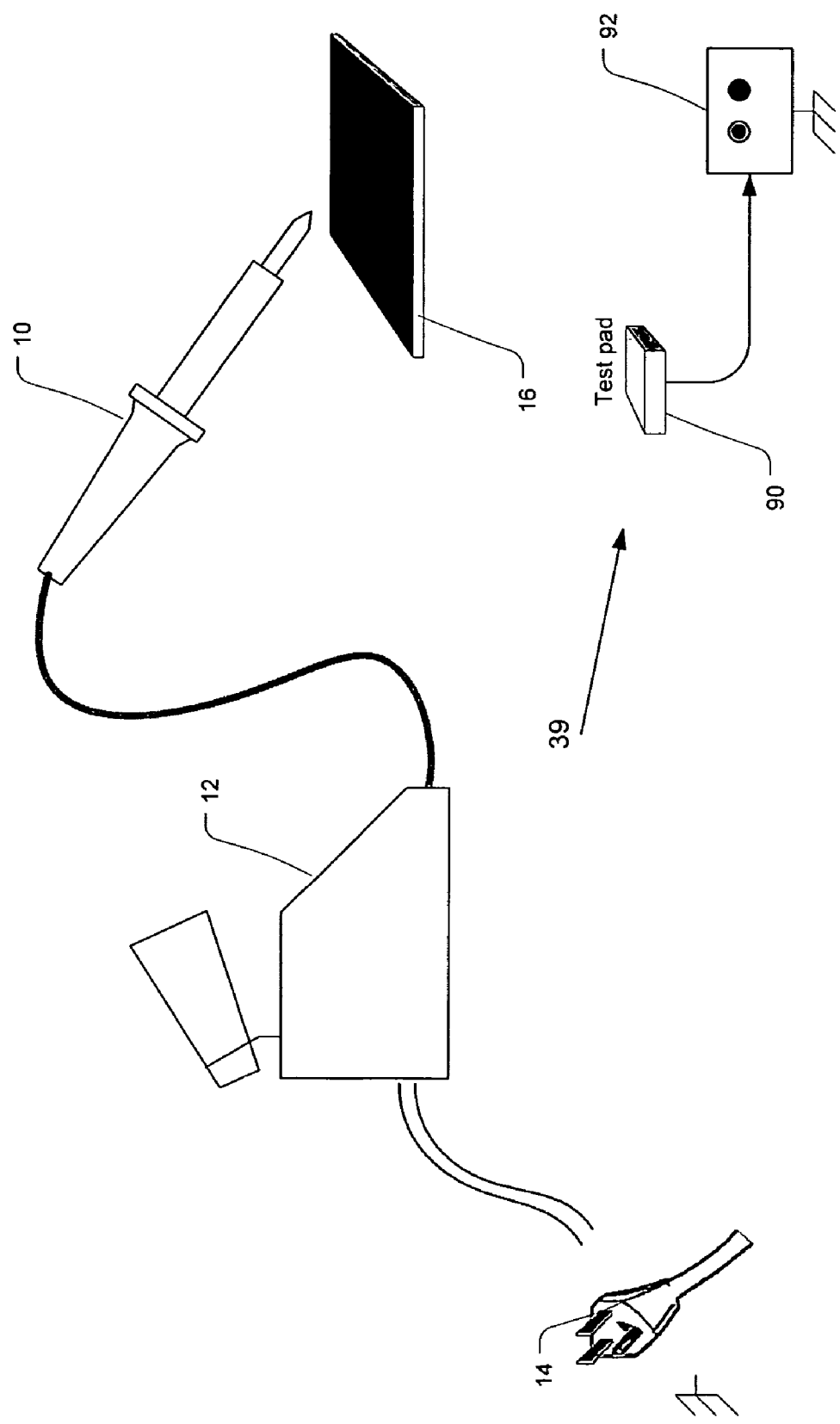
FIG. 8 depicts an example of another embodiment of the monitoring device in accordance with the invention.

FIG. 8 depicts an example of another embodiment of the monitoring device 39 wherein like elements have the same function as described above. In this embodiment, the device 39 may further comprise a test pad 90, made typically of a metal, where an operator would touch periodically the tip of the soldering iron 10 to the test pad and a monitor and alarm apparatus 92 that comprises any of the measurement and alarm circuits and devices in FIGS. 4-7 wherein the apparatus would be triggered if the voltage on the tip of the soldering iron exceeded some preset limit.

Figure 9:
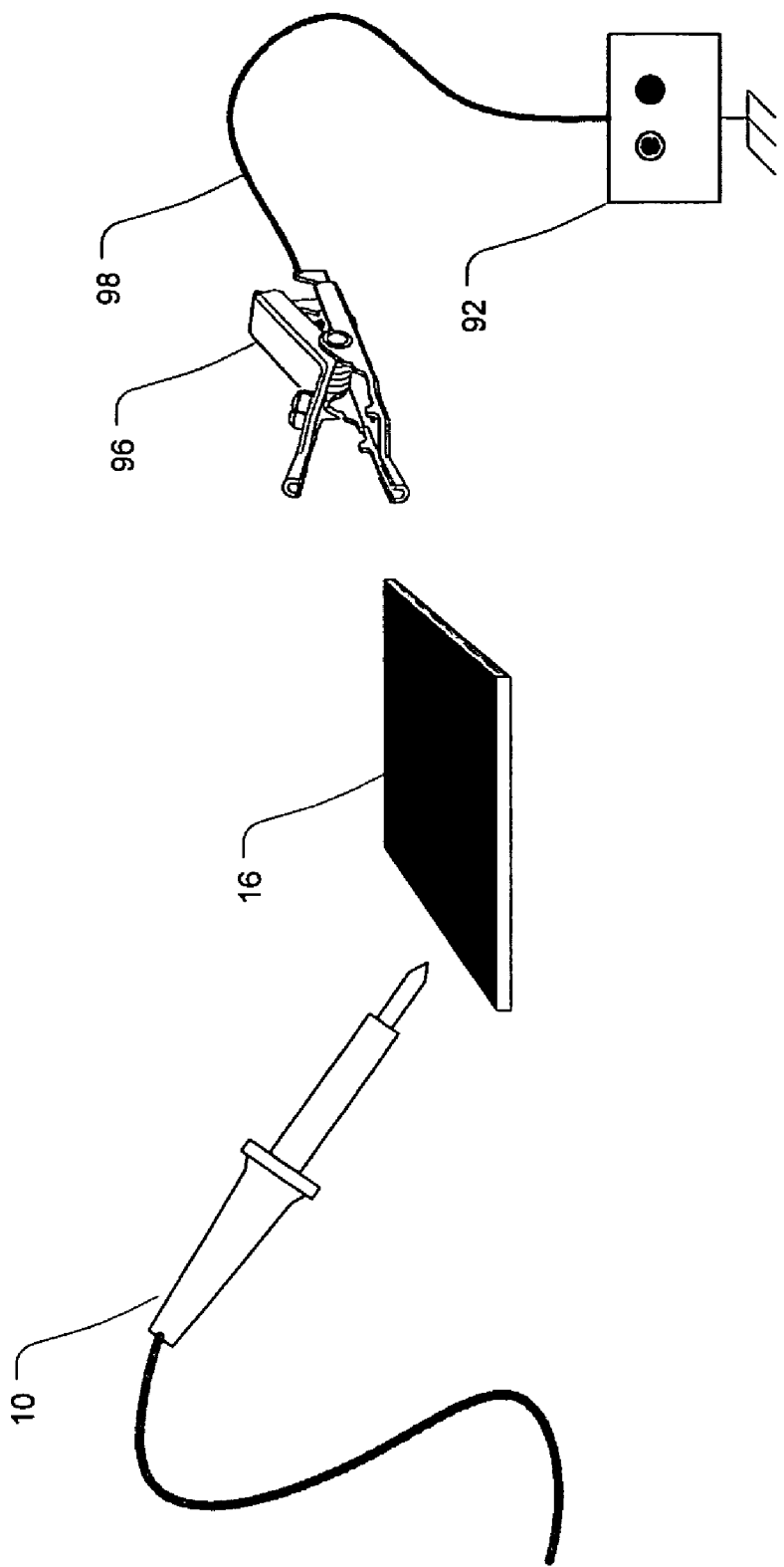
FIG. 9 illustrates an example of a way to attach the monitoring device to a circuit board.

FIG. 9 illustrates an example of a way to attach the apparatus 92 to a circuit board. In operation, an operator would touch the circuit board 16 periodically during assembly. In many cases, the electrical contact by the soldering iron will be made with a ground plane of the circuit board since most of the components on the circuit board are connected to the ground plane. Therefore, it is recommended to connect the apparatus 92 to the ground plane of the circuit board 16 using a clip connector 96 that is connected to the apparatus 92 via a wire 98. Thus, whenever the soldering iron touches a pad/component connected to the ground plane during the normal soldering process, the apparatus 92 will measure the voltage and should the measured voltage exceed the threshold, raise an alarm.

Figure 10:
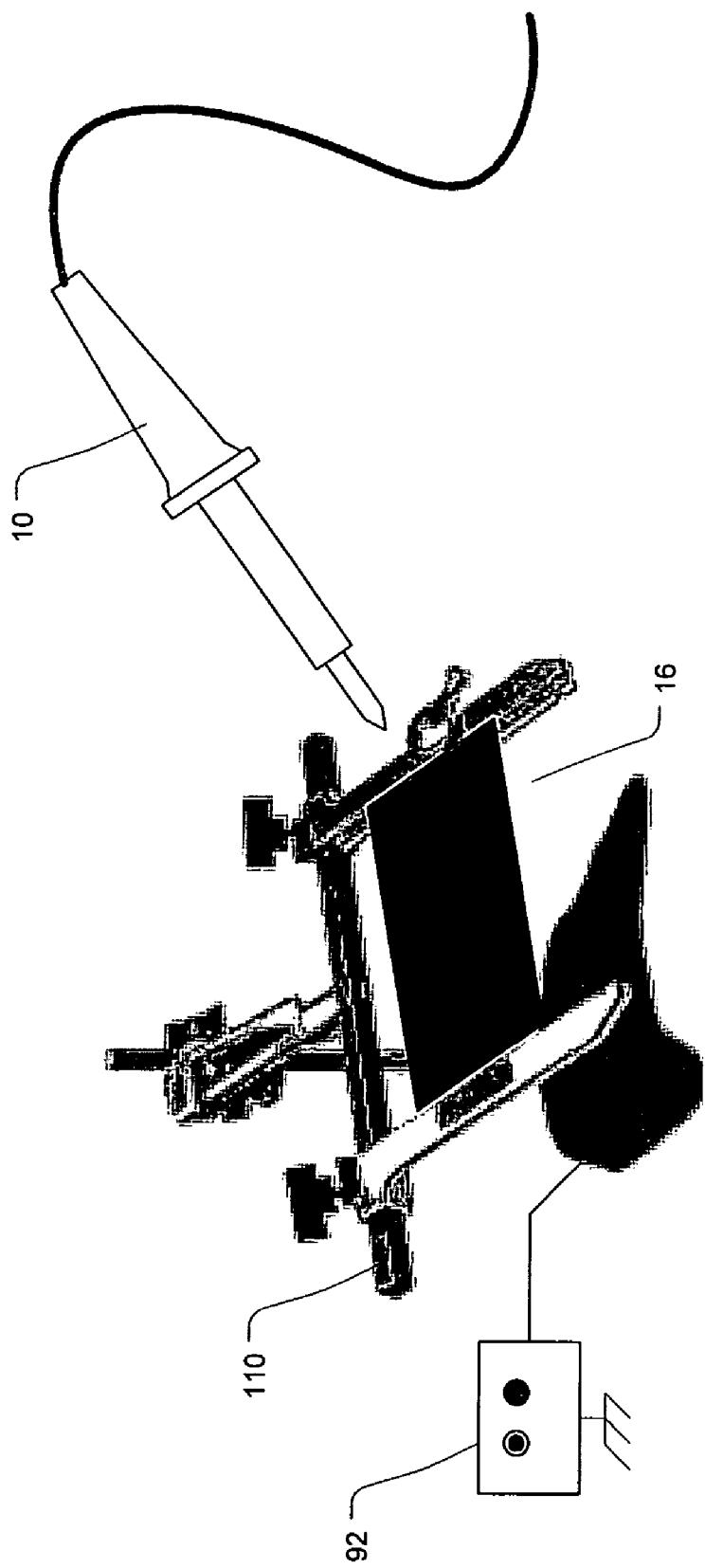
FIG. 10 illustrates an example of a way to attach the monitoring device to a circuit board held in a vise.
Figure 11:
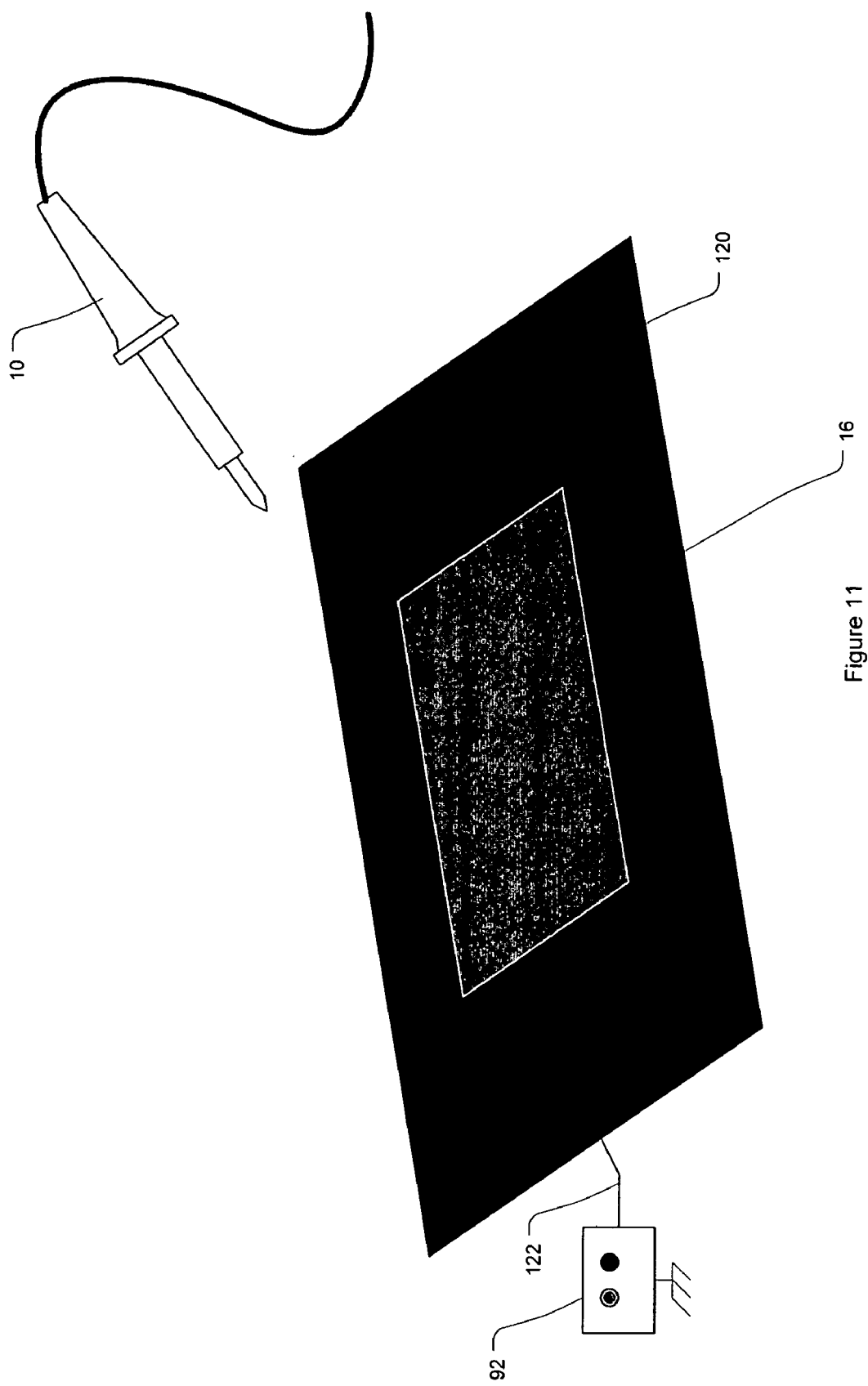
FIG. 11 illustrates an example of a way to attach the monitoring device to a circuit board placed on a static-dissipative mat.

FIG. 10 illustrates an example of a way to attach the apparatus 92 to a circuit board 16 held in a vise 110 since circuit boards often are placed in a vise 110. In many such cases, the vise is metal and there is an electrical contact between the circuit board 16 and the vise 110 so that it is possible to connect an input of the apparatus 92 to the vise 110 instead of directly to the circuit board 16. FIG. 11 illustrates an example of a way to attach the apparatus 92 to a circuit board 16 placed on a static-dissipative mat 120 wherein the apparatus 92 can be connected to the mat itself and the grounding of the mat can be provided via the apparatus 92 as well.

Figure 12:
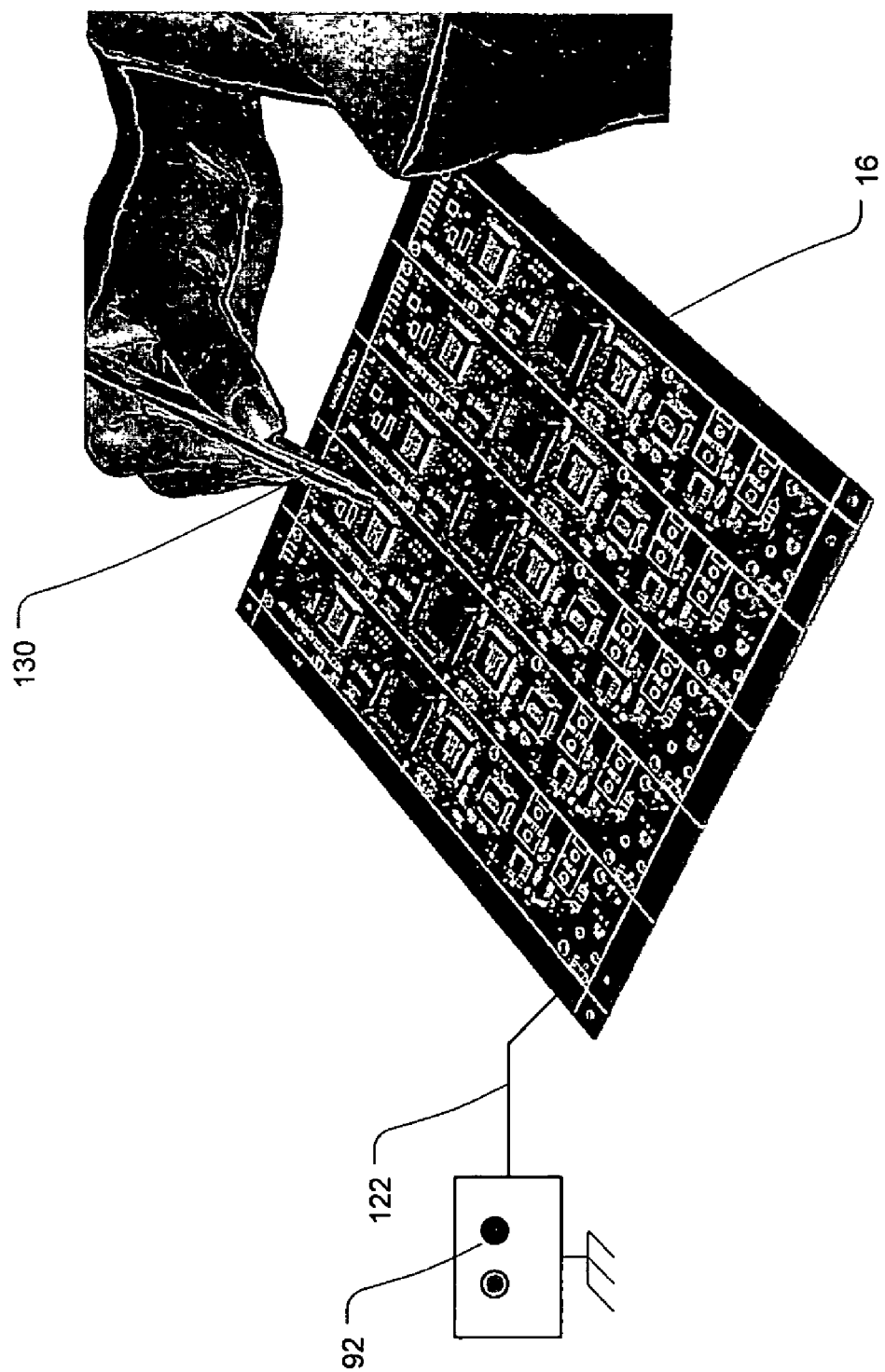
FIG. 12 illustrates that the monitoring device may also be used to monitor the ESD exposure of a circuit.

FIG. 12 illustrates that the apparatus 92 may also be used to monitor the ESD exposure of a circuit. As depicted, a worker touches the circuit board 16 with a pair of tweezers 130. If the worker is not properly grounded, an electrostatic discharge follows that can damage sensitive devices. The apparatus 92 (that incorporates the devices and circuits shown in FIG. 7) can be used to detect the magnitude of such ESD Events using the peak detector and raise an alarm when the ESD Event exceeds some magnitude.

Figure 13:
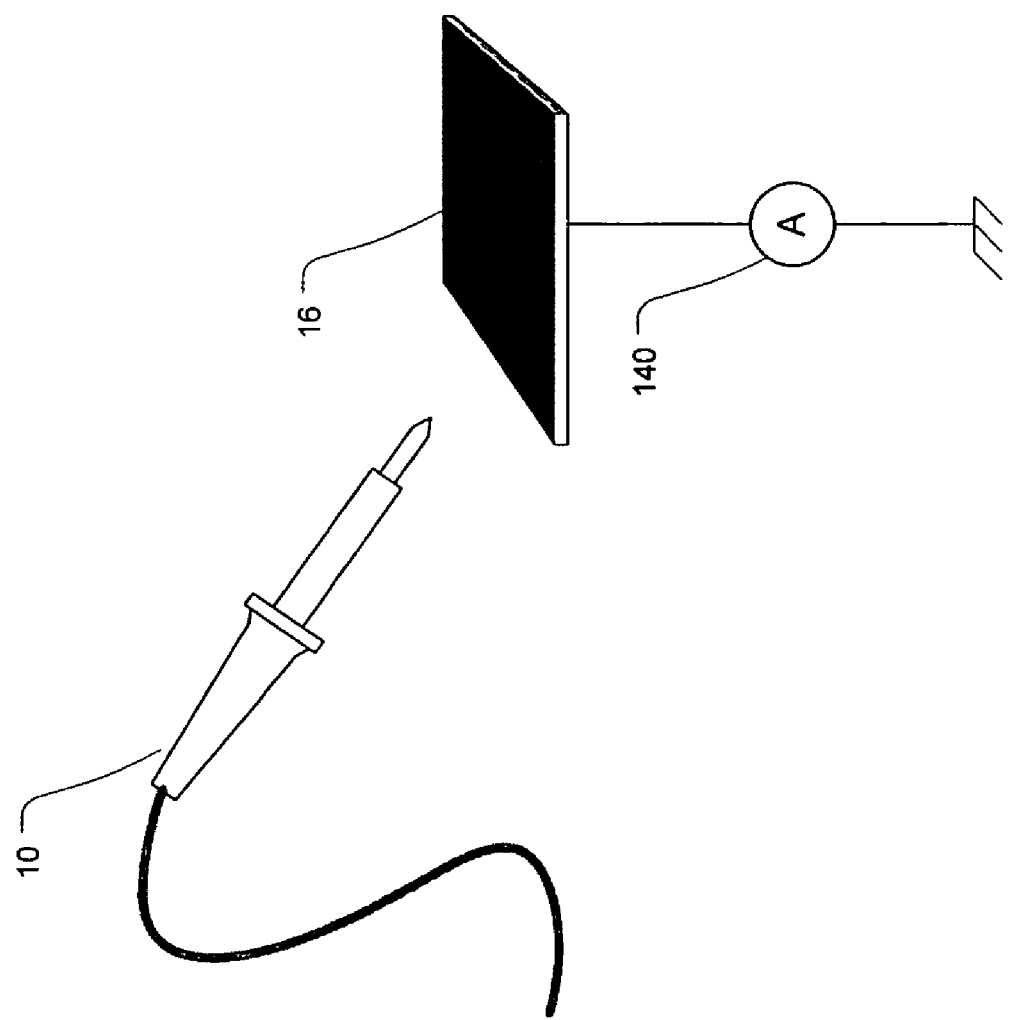
FIG. 13 illustrates a method for measuring the current passing through a circuit board.
Figure 14:
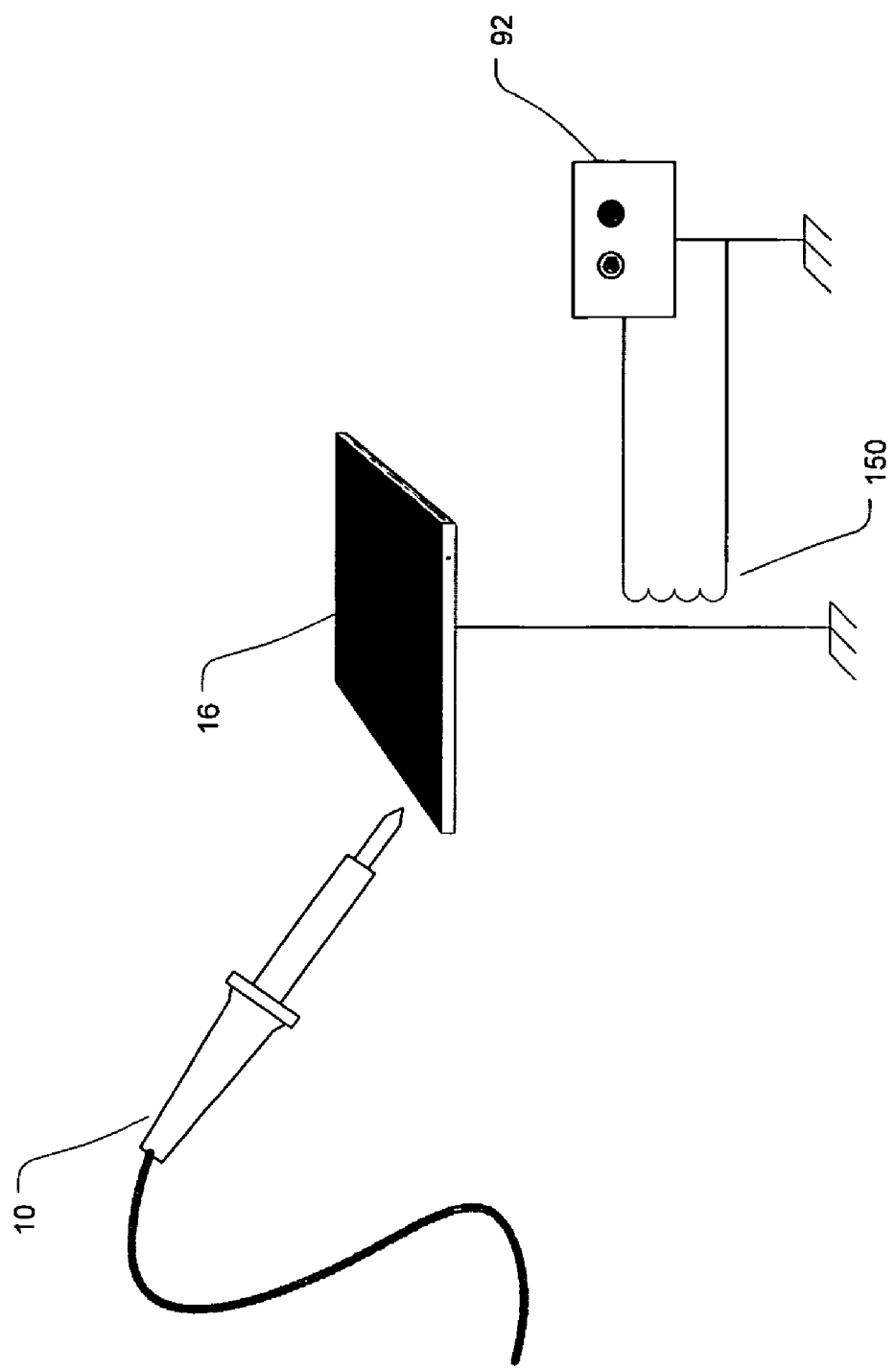
FIG. 14 illustrates another method for measuring the current passing through a circuit board.

FIG. 13 illustrates a method for measuring the current passing through a circuit board and FIG. 14 illustrates another method for measuring the current passing through a circuit board. The devices described above with reference to FIGS. 4-12 measure the voltage on the circuit board 16. However, it is also possible to measure current through the circuit board 16 directly using an ampermeter 140 as shown in FIG. 13 or by using a transformer current probe as shown in FIG. 14. The current transformer sensor 150 generates a voltage that can be measured by the apparatus 92.

Figure 15:
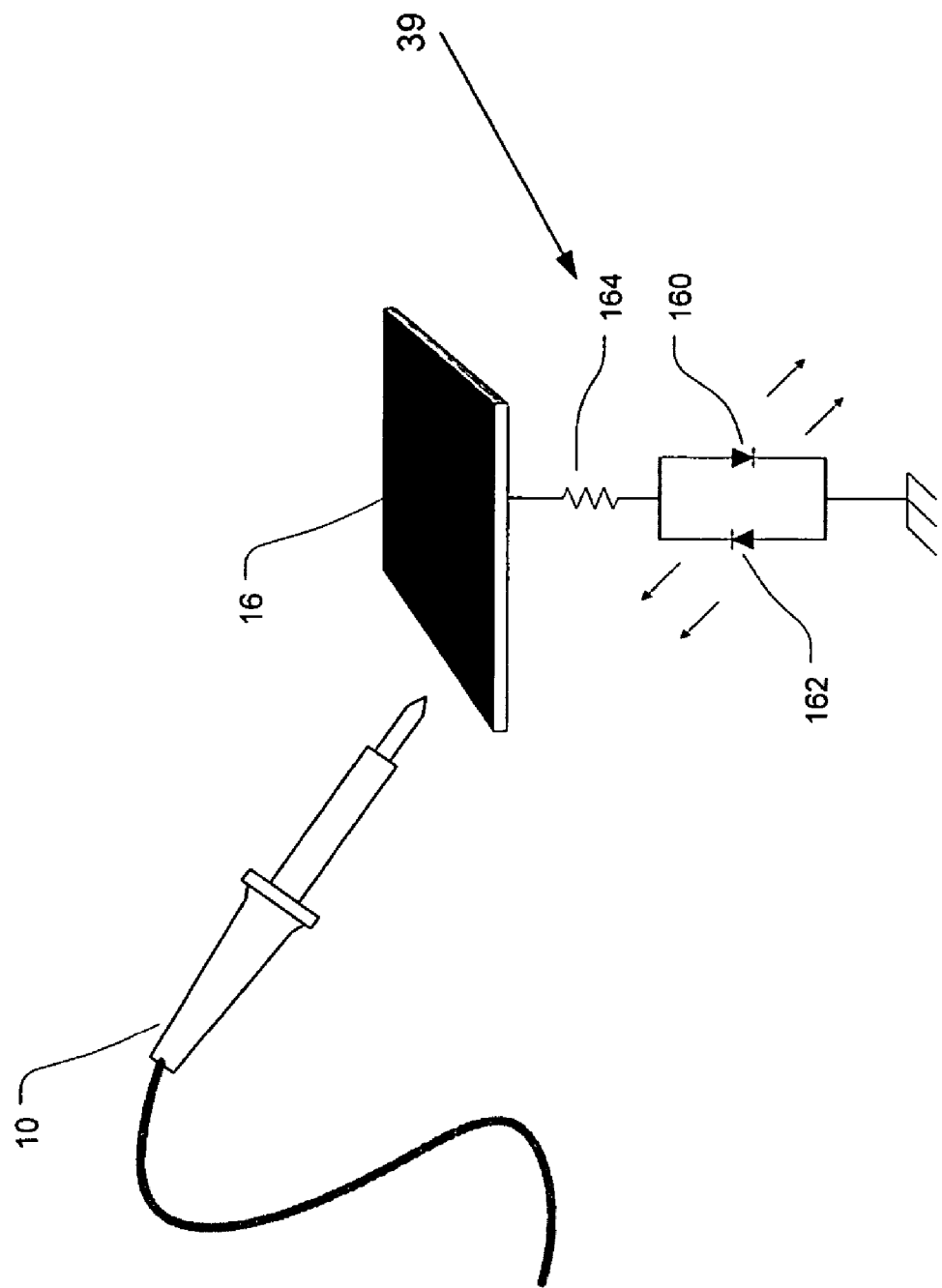
FIG. 15 illustrates an example of an implementation of the monitoring device that measures the voltage on a circuit board.

FIG. 15 illustrates an example of an implementation of the monitoring device 39 that measures the voltage on a circuit board. This implementation is a simple implementation of the device 39 wherein the device 39 comprises two back-to-back LEDs 160 and 162 wherein both resistors are connected between ground and via a resistor 164 to the circuit board 16. These LEDs 160, 162 then light up every time the voltage on the circuit board 16 exceeds the threshold voltage of the LEDs (typically, between 1.5 and 2V).

Figure 16:
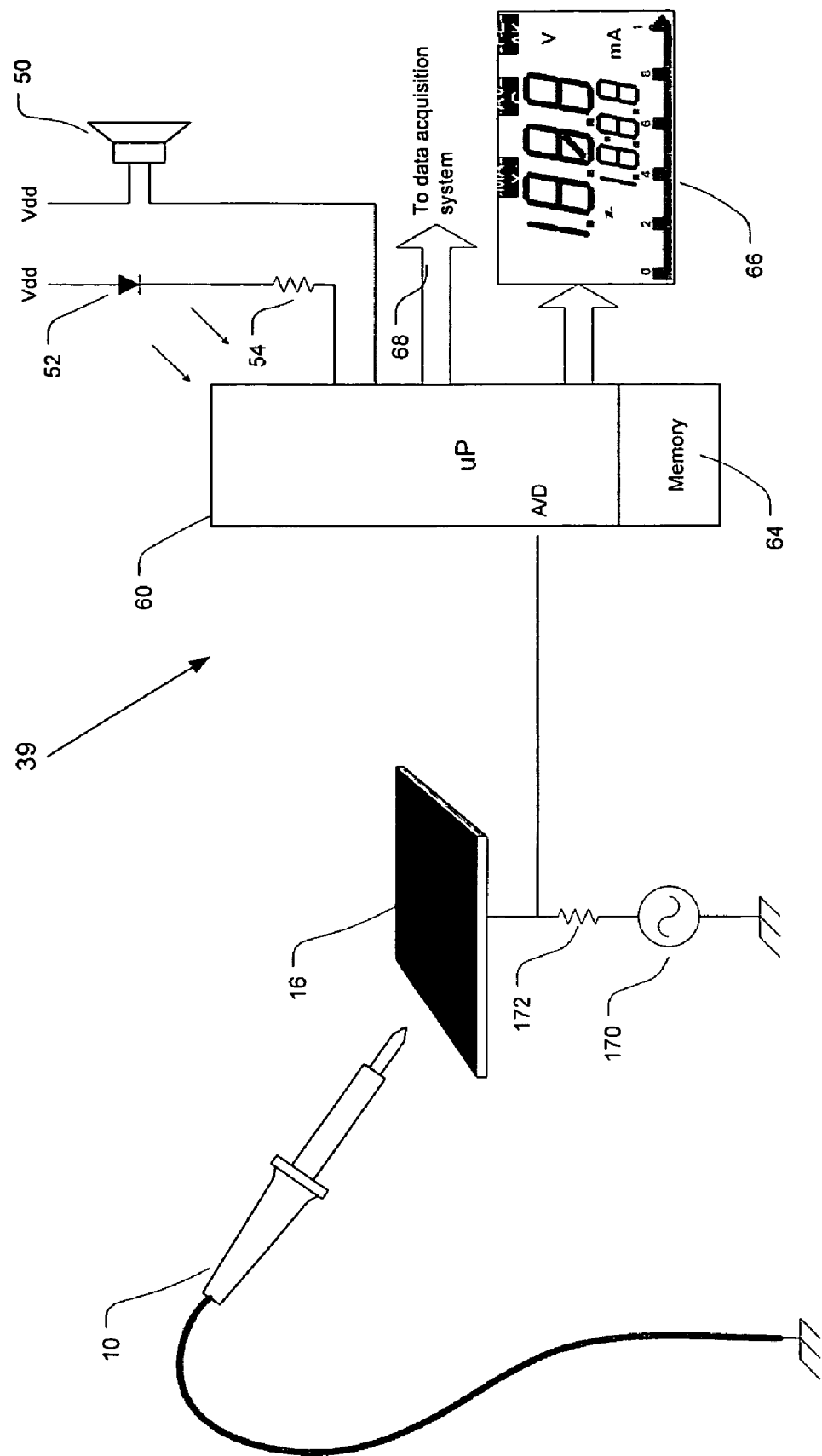
FIG. 16 illustrates another embodiment of the monitoring device that detects overexposure to voltage and proper grounding of the tool.

FIG. 16 illustrates another embodiment of the monitoring device 39 that detects overexposure to voltage and proper grounding of the tool. In this embodiment, like reference numbers and have like functions as described above. This embodiment of the device 39 combines the detection of overexposure with the detection of proper grounding of soldering iron's tip. Thus, in addition to the above described overexposure detection elements, the embodiment may further comprise a signal source 170 with one terminal grounded that generates sufficiently safe voltage and a resistor 172 connected between second terminal of the voltage source 170 and the circuit board 16. When the soldering iron 10 makes contact with the circuit board 16, the voltage on the circuit board 16 drops if the soldering iron 10 is properly grounded since the voltage generated by the signal source is grounded by the properly grounded soldering iron 10. The processor 60 is capable of distinguishing the typical overexposure voltage signals generated by the soldering iron from the voltage signal generated by the signal source 170 which is described in more detail in U.S. Pat. No. 6,930,612 that is incorporated herein by reference and is owned by the same assignee as the present invention. The device 39 of FIG. 16 may also have a mechanism so that the ground monitoring is not activated until a verified ground connection is established. The device 39 may also generate a display of the voltage levels and proper grounding of the tool as well as generate alarms.

In many occasions, a monitored circuit board 16 can pickup noise from 50/60 Hz signals in the air due to electromagnetic fields from mains. The waveform of that noise is shown in FIG. 16a. This signal cannot produce high currents and thus is not dangerous to the sensitive components so that, in such cases, it is important to separate this situation from the one where a tool applies voltage to the circuit board that can inflict damage. To handle this case, the monitoring of excessive voltage is coupled with monitoring of the tool connection to the circuit board. FIGS. 16b and 16c depict typical waveforms when a tool, such as the soldering iron 10, with excessive voltage touches the circuit board. In more detail, FIG. 16b shows the waveform when an ungrounded soldering iron touches the circuit board wherein the resulting waveform is a very high magnitude signal and much higher than the one induced by electromagnetic fields as shown in FIG. 16a. FIG. 16c shows a situation where the tool 10, such as the soldering iron, has a DC bias voltage which is never caused by electromagnetic fields from the mains. Therefore, in order to increase the accuracy of the overvoltage detection, the device in accordance with the invention may also include a process/circuitry to discriminate between an overvoltage condition caused by a tool (which should be detected) and situations in which typical 50/60 Hz noise is detected (which should be discarded as a false detection.) To accomplish this discrimination, the device may accept a certain level of voltage induced by the mains and only alarm when the voltage exceeds that level (such as by setting the maximum and minimum levels so that the voltage from the mains do not exceed the limits). The device may also monitor current in the ground connection of the circuit, not voltage, since induced voltage cannot generate high current levels that might damage the components. Finally, the device may monitor the voltage level applied to the circuit board only when any ground connection, however poor, is detected.

Figure 17:
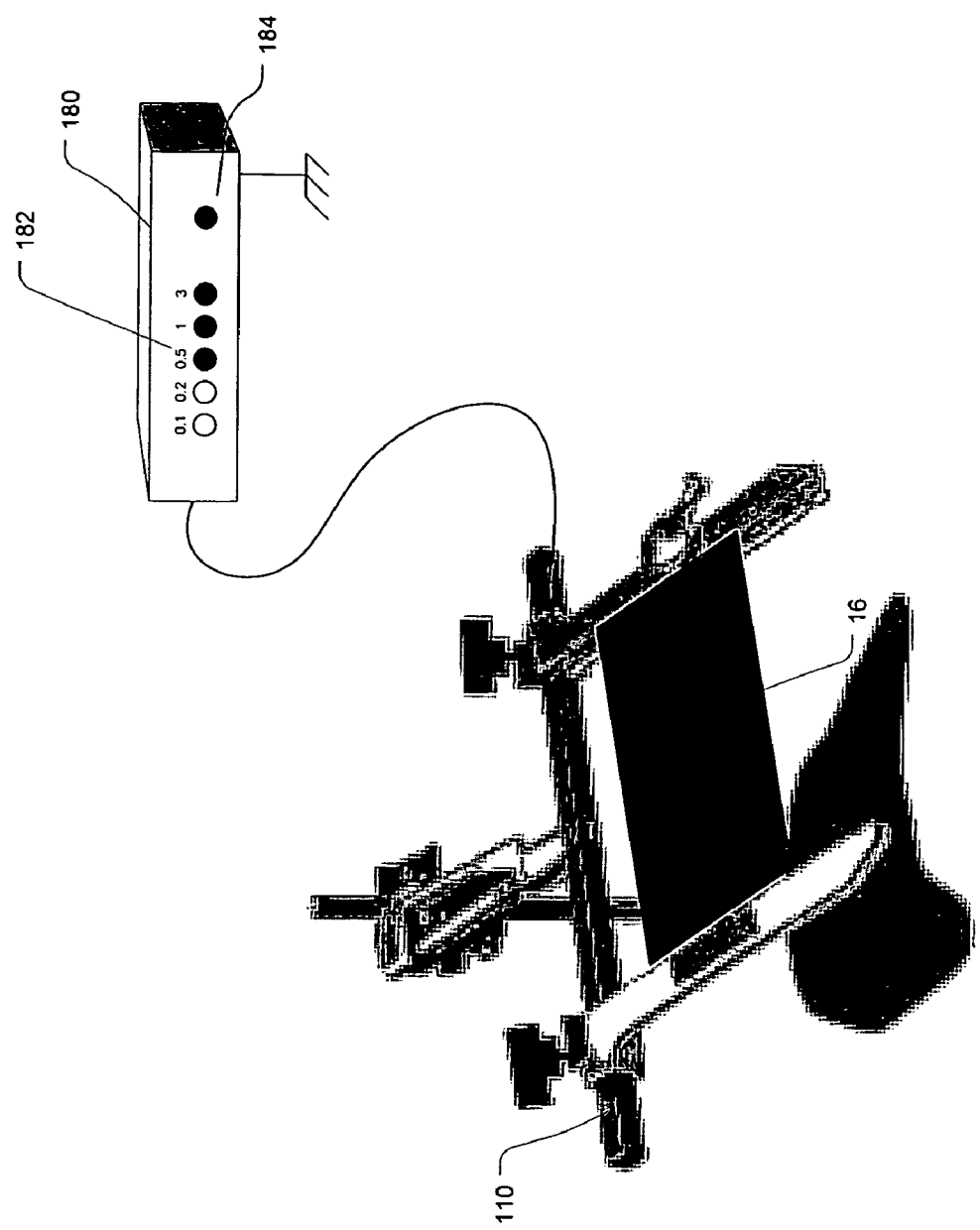
FIG. 17 shows an example of an embodiment of the monitoring device.

FIG. 17 shows an example of an embodiment of the device 39. In particular, an apparatus 180 (that incorporates the circuits and devices shown in FIGS. 4-7) connected to the vise 110 may comprise a set of LEDs 182 (that preferably may be of different colors to indicate different voltage levels) wherein a different LED is illuminated depending on the measured voltage level wherein the processor can activate the appropriate LED. The apparatus 180 may further comprise a buzzer 184 that is triggered when the voltage exceeds some predetermined level.

While the foregoing has been with reference to a particular embodiment of the invention, it will be appreciated by those skilled in the art that changes in this embodiment may be made without departing from the principles and spirit of the invention, the scope of which is defined by the appended claims.

The invention claimed is:

1. A device for monitoring the exposure of sensitive components on a circuit board to a tool used to assemble the sensitive components on the circuit board, the device comprising:
    a measuring circuit having an electrically conductive element that couples to a circuit board being assembled with sensitive components by a tool and that determines one of a voltage and a current applied to a ground plane of the circuit board by the tool that electrically contacts the ground plane of the circuit board wherein one of the voltage and current is directly measured based on one of the voltage and current applied to the ground plane of the circuit board; and
    a circuit that generates a signal indicating one of the voltage and current applied to the ground plane of the circuit board when the tool electrically contacts the ground plane of the circuit board,
    wherein the measuring circuit further comprises a voltage determining circuit that measures the voltage applied to the ground plane of the circuit board by the assembly tool, and
    wherein the voltage determining circuit further comprises an analog to digital converter coupled to the voltage from the circuit board that converts the voltage from the circuit board into a digital output signal and a processor coupled to the digital output signal that compares the digital output signal to a minimum level and a maximum level and generates an output signal when the voltage from the circuit board is one of greater than the maximum level and less than the minimum level.

2. The device of claim 1, wherein the circuit that generates a signal further comprises a circuit that generates a signal when one of the voltage and current exceeds a preset threshold value at which the sensitive components on the circuit board are likely to be damaged.

3. The device of claim 1, wherein the circuit that generates a signal further comprises a circuit that generates a signal corresponding to a value one of the voltage and current applied to the ground plane of the circuit board.

4. The device of claim 1, wherein the circuit that generates a signal further comprises an alarm circuit that generates an alarm when one of the voltage and current exceeds a preset threshold value at which the sensitive components on the circuit board are likely to be damaged.

5. The device of claim 1, wherein the measuring circuit is connected between ground and the circuit board through a resistor.

6. The device of claim 1 further comprising an amplifier coupled between the circuit board and the measuring circuit that amplifies the voltage applied to the ground plane of the circuit board.

7. The device of claim 1, wherein the measuring circuit further comprises a memory that stores the digital output signal and the output signal.

8. The device of claim 1, wherein the measuring circuit further comprises a peak detector that measures a short transient signal that occurs when the assembly tool electrically contacts the ground plane of the circuit board and generates a signal representative of the short transient signal.

9. The device of claim 1, wherein the measuring circuit further comprises a ground monitoring circuit that measures the ground of the tool.

10. The device of claim 1 further comprising a test pad onto which a tip of the tool is placed in order to determine a voltage at the tip of the tool.

11. The device of claim 4, wherein the alarm circuit further comprises one or more of a buzzer and at least one light emitting diode.

12. The device of claim 1, wherein circuit generating the signal further comprises a disabling circuit that disables the tool when one of the voltage and current exceeds the preset threshold value.

13. The device of claim 12, wherein the disabling circuit further comprises a relay that cuts off the power from the tool.

14. The device of claim 1, wherein the tool further comprises a soldering iron.

15. The device of claim 1 further comprising a circuit that measures the electrostatic discharge that occurs when the tool electrically contacts the ground plane of the circuit board.

16. A method for monitoring the exposure of sensitive components on a circuit board by a tool used to assemble the sensitive components on the circuit board, the method comprising:

coupling a monitoring device directly to a conductive portion of a circuit board;

measuring, using the monitoring device, one of a voltage and current applied to a ground plane of the circuit board by a tool that is used to assemble a sensitive component on the circuit board;

generating a signal indicating that one of the voltage and current applied to the ground plane of the circuit board by the tool exceeds a preset limit; and detecting a ground connection of the tool, wherein generating a signal indicating that one of the voltage and current applied to the ground plane of the circuit board by the tool exceeds a preset limit further comprises disabling the signal indicating that one of the voltage and current applied to the ground plane of the circuit board by the tool exceeds a preset limit unless a ground connection of the tool is detected.

17. The method of claim 16, wherein generating the signal further comprises generating an alarm signal indicating that one of the voltage and current applied to the ground plane of the circuit board by the tool exceeds a preset limit.

18. The method of claim 16, wherein generating the signal further comprises generating a signal to disable the tool.

19. The method of claim 16, wherein generating the signal further comprises generating a signal indicating the value of one of the voltage and current applied to the ground plane of the circuit board.

20. The method of claim 16, wherein measuring one of a voltage and current applied to a ground plane of the circuit board further comprises digitally measuring one of a voltage and current applied to the ground plane of the circuit board.

21. The method of claim 16, wherein measuring one of a voltage and current applied to a ground plane of the circuit board further comprises using analog signals to measure one of a voltage and current applied to the ground plane of the circuit board.

* * * * *